(12) United States Patent
Weigl

(10) Patent No.: US 8,646,170 B2
(45) Date of Patent: Feb. 11, 2014

(54) DEVICE FOR PRODUCING PHOTOVOLTAIC MODULES

(75) Inventor: Helmut Weigl, Straubing (DE)

(73) Assignee: Grenzebach Maschinenbau GmbH, Asbach-Baeumenheim (DE)

(*) Notice: Subject to any disclaimer, the term of this patent is extended or adjusted under 35 U.S.C. 154(b) by 394 days.

(21) Appl. No.: 13/001,400

(22) PCT Filed: Aug. 18, 2009

(86) PCT No.: PCT/IB2009/007059
§ 371 (c)(1),
(2), (4) Date: Dec. 23, 2010

(87) PCT Pub. No.: WO2010/015942
PCT Pub. Date: Feb. 11, 2010

(65) Prior Publication Data
US 2011/0179619 A1    Jul. 28, 2011

(30) Foreign Application Priority Data

Aug. 4, 2008 (DE) .......................... 10 2008 036 274

(51) Int. Cl.
*B23P 19/00* (2006.01)
(52) U.S. Cl.
USPC ................ 29/700; 29/592.1; 29/729; 29/738; 29/742
(58) Field of Classification Search
USPC ......... 29/592.1, 729, 738, 742, 890.033, 700, 29/732
See application file for complete search history.

(56) References Cited

U.S. PATENT DOCUMENTS

| | | | |
|---|---|---|---|
| 4,267,003 A | 5/1981 | Mesch et al. | |
| 6,353,042 B1 | 3/2002 | Hanoka et al. | |
| 6,659,265 B2* | 12/2003 | Pfeilschifter et al. | 198/468.6 |
| 8,225,496 B2* | 7/2012 | Bachrach et al. | 29/726 |
| 2003/0044539 A1* | 3/2003 | Oswald | 427/404 |
| 2003/0062245 A1* | 4/2003 | Pfeilschifter et al. | 198/339.1 |
| 2005/0217718 A1* | 10/2005 | Dings et al. | 136/256 |
| 2005/0284516 A1 | 12/2005 | Koll | |
| 2009/0077804 A1* | 3/2009 | Bachrach et al. | 29/890.033 |
| 2009/0077805 A1* | 3/2009 | Bachrach et al. | 29/890.033 |
| 2009/0188102 A1* | 7/2009 | Lu et al. | 29/527.1 |
| 2009/0221217 A1* | 9/2009 | Gajaria et al. | 451/58 |

FOREIGN PATENT DOCUMENTS

| | | |
|---|---|---|
| DE | 10 2004 030 411 A1 | 1/2006 |
| DE | 10 2005 060 452 A1 | 6/2007 |
| EP | 1 298 080 B1 | 3/2004 |

(Continued)

OTHER PUBLICATIONS

International Search Report, International Application No. PCT/IB2009/007059, Date of mailing: Apr. 19, 2010, 3 pages.

*Primary Examiner* — Carl Arbes
(74) *Attorney, Agent, or Firm* — Slater & Matsil, L.L.P.

(57) ABSTRACT

An apparatus and a method for automatically joining components of photovoltaic elements are disclosed. The apparatus includes: a) at least two manufacturing lines and at least two assembly bridges for joining the substrates, films and glass panes, b) a stacking device for film feeding and a conveyor belt for feeding the glass panes, c) devices for centering and suctioning the films and the glass plates, d) devices for transporting and fixing the film transport frame and the glass transport frame e) devices for lowering the films and the glass plates from the respective transport frames, and f) devices for further transport.

20 Claims, 8 Drawing Sheets

(56) References Cited

FOREIGN PATENT DOCUMENTS

| | | |
|---|---|---|
| EP | 1 647 532 A1 | 4/2006 |
| JP | 06-227655 A | 8/1994 |
| JP | 2001-180822 A | 7/2001 |
| JP | 2004-153137 A | 5/2004 |
| JP | 2006-021856 A | 1/2006 |
| JP | 2007-008698 A | 1/2007 |
| JP | 2007-234720 A | 9/2007 |
| JP | 2008-182256 A | 8/2008 |
| WO | WO 03/098704 A1 | 11/2003 |

* cited by examiner

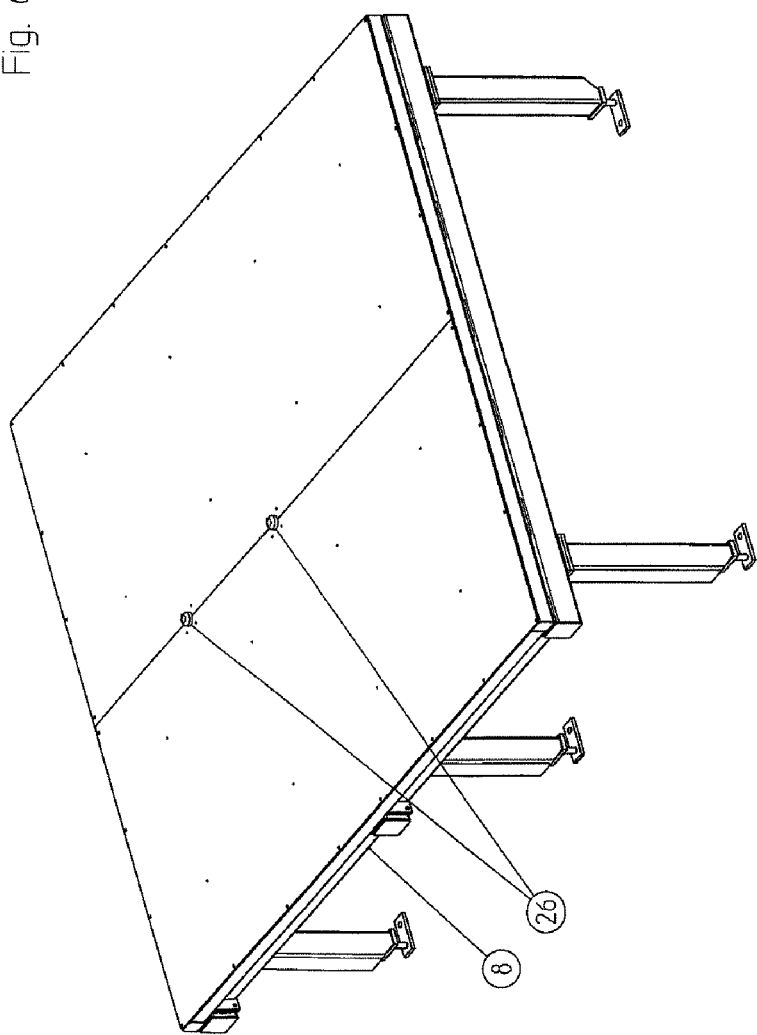

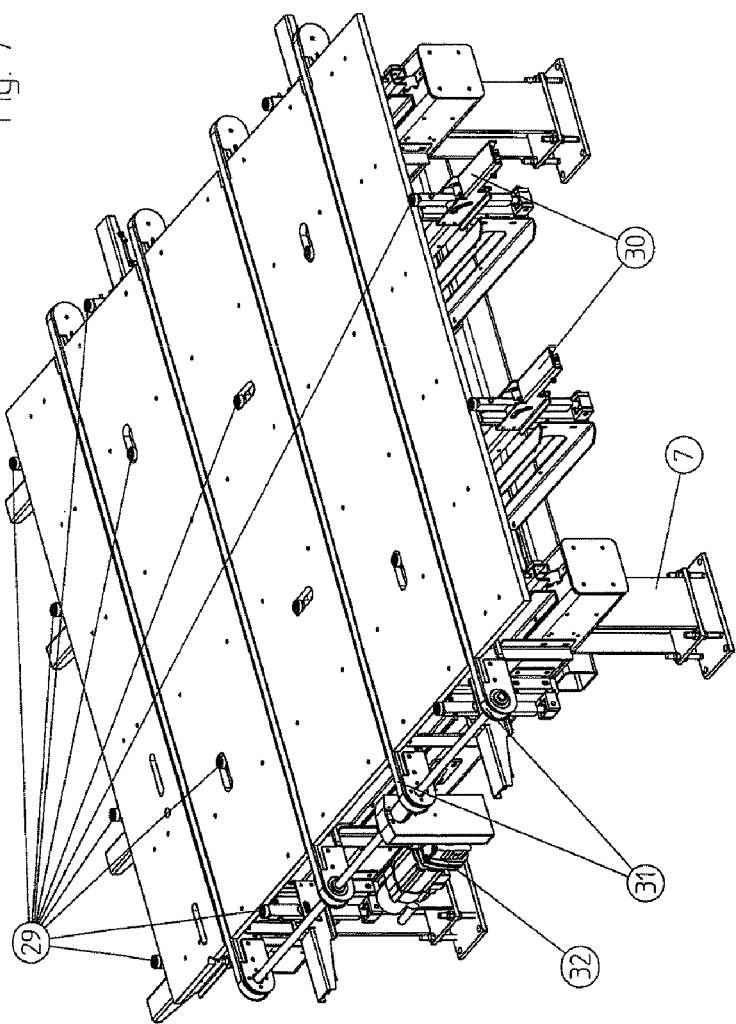

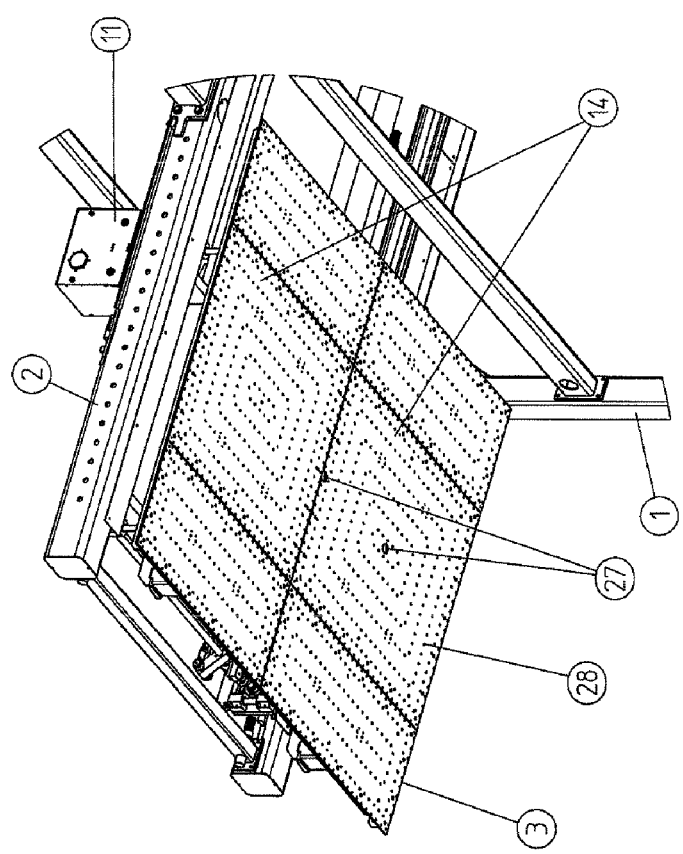

DEVICE FOR PRODUCING PHOTOVOLTAIC MODULES

This patent application is a national phase filing under section 371 of PCT/IB2009/007059, filed Aug. 18, 2009, which claims the priority of German patent application 10 2008 036 274.3, filed Aug. 4, 2008, each of which is incorporated herein by reference in its entirety.

TECHNICAL FIELD

The invention relates to the automatic production of a photovoltaic module.

BACKGROUND

Modern glass facades are often not just a function element of a structural body, but are increasingly also used for solar electricity generation. Tailor-made solar modules allow accurately fitting integration in construction grids and profiles. Semitransparent solar cells, or else opaque solar cells with transparent areas, make photovoltaic glazing systems appear as if light is flooding through them. In this case, the solar cells frequently provide the desired effect of solar and dazzling protection.

The production of such photovoltaic installations requires working conditions such as those which are normally used in particular for the production of semiconductors and integrated electronic circuits. Therefore, the production of photovoltaic installations is still relatively expensive. There is therefore an aim to produce photovoltaic elements in large batches, and thus to reduce the costs. Considered from the outside, a photovoltaic module represents the connection of a substrate panel composed of glass, a photovoltaic element and a glass pane as covering glass by means of a film which adhesively bonds these glass panes under the influence of heat.

DE 10 2004 030 411 A1 discloses a photovoltaic element such as this, a solar module as laminated safety glass.

One object of this laid-open specification is to provide solar modules having the characteristics of laminated safety glass systems using films based on polyvinyl butyral (PVB).

This object is achieved by means of a solar module as laminated safety glass, comprising a laminate of
  a) a glass pane,
  b) at least one solar cell unit which is arranged between two films based on PCB, and
  c) a cover at the rear,
  characterized in that
  at least one of the PVB-based films has a tear resistance of at least 16 N/mm².

This document does not describe how an element such as this is intended to be produced in large batches.

SUMMARY OF THE INVENTION

The apparatus according to an embodiment of the invention and the method according to an embodiment of the invention are ensuring the production of a photovoltaic module, that is to say the joining of corresponding components, on an automatically controlled basis, reliably and cost-effectively from all respects, with short cycle times.

BRIEF DESCRIPTION OF THE DRAWINGS

Embodiments of the invention will be described in more detail in the following text with reference to figures in which:

FIG. 6: shows an illustration of the film centering on the stacking table,
FIG. 7: shows an illustration of the centering of a glass pane,
and
FIG. 8: shows an illustration of the film centering on the transport frame.

Figure 1:
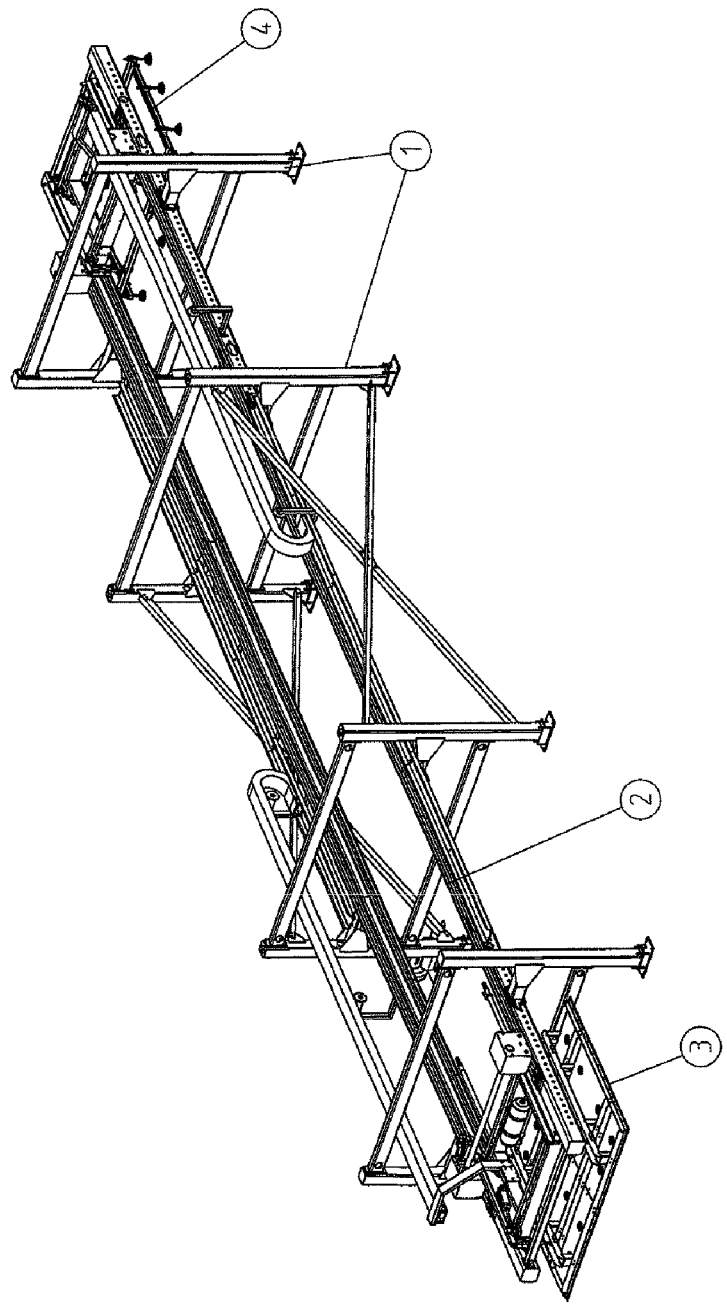
FIG. 1: shows a perspective view of a placement bridge.

The following list of reference symbols may be used in conjunction with the drawings:
(1) Gantries (base frames)
(2) Main rail supports
(3) Film transport frame
(4) Glass transport frame
(5) Production line 1
(6) Production line 2
(7) Conveyor belt for glass pane supply
(8) Stacking table for film supply
(9) Supply and control line channel
(10) Servo drive for film transport device
(11) Omega drive and centering device for film
(12) Drive for vertical lifting movement
(13) Centering opening for centering pin (line 1)
(14) Sensor for film detection
(15) Vacuum-pressure pump
(16) Vacuum-pressure suckers
(17) Servo drive for glass transport device
(18) Omega drive and centering device for glass
(19) Centering opening for centering pin (line 2)
(20) Drive (toothed belt)
(21) Guide rollers for omega drive
(22) Toothed belt
(23) Sliding rollers for centering pin
(24) Centering pin
(25) Linear-movement cylinder for centering pin
(26) Film centering on the stacking table
(27) Film centering on the suction frame
(28) Suction openings for film transport frame
(29) Centering device for glass pane
(30) Drives for centering device
(31) Conveyor belts
(32) Drive for conveyor belts
(A) Placement bridge
(B) Placement bridge

DETAILED DESCRIPTION OF ILLUSTRATIVE EMBODIMENTS

In the present case, a photovoltaic module consists of a so-called substrate, that is to say a glass pane with a photovoltaically acting coating, a film placed on it and a further glass pane as a cover, the so-called bottom glass. The film is in this case in the form of a so-called melting film, which produces the connection between two glass panes in a heating process.

These three elements are joined using the apparatus according to an embodiment of the invention.

During this process, substrate panels are moved to corresponding production lines, which on the one hand are fitted with a film with matched clock times, and on the other hand are in turn covered by a further glass pane.

FIG. 1 shows a perspective view of a placement bridge which has been developed for this purpose. This essentially comprises main rail supports (2) which are supported on gantries (1). Only four gantries (1) are shown in the example in FIG. 1 although even further gantries (1) can be inserted in the center if the main rail supports (2) need to be lengthened.

A film transport frame (3) is shown on the left-hand side of the illustrated placement bridge, and a glass transport frame (4) can be seen on the right-hand side.

Figure 2:
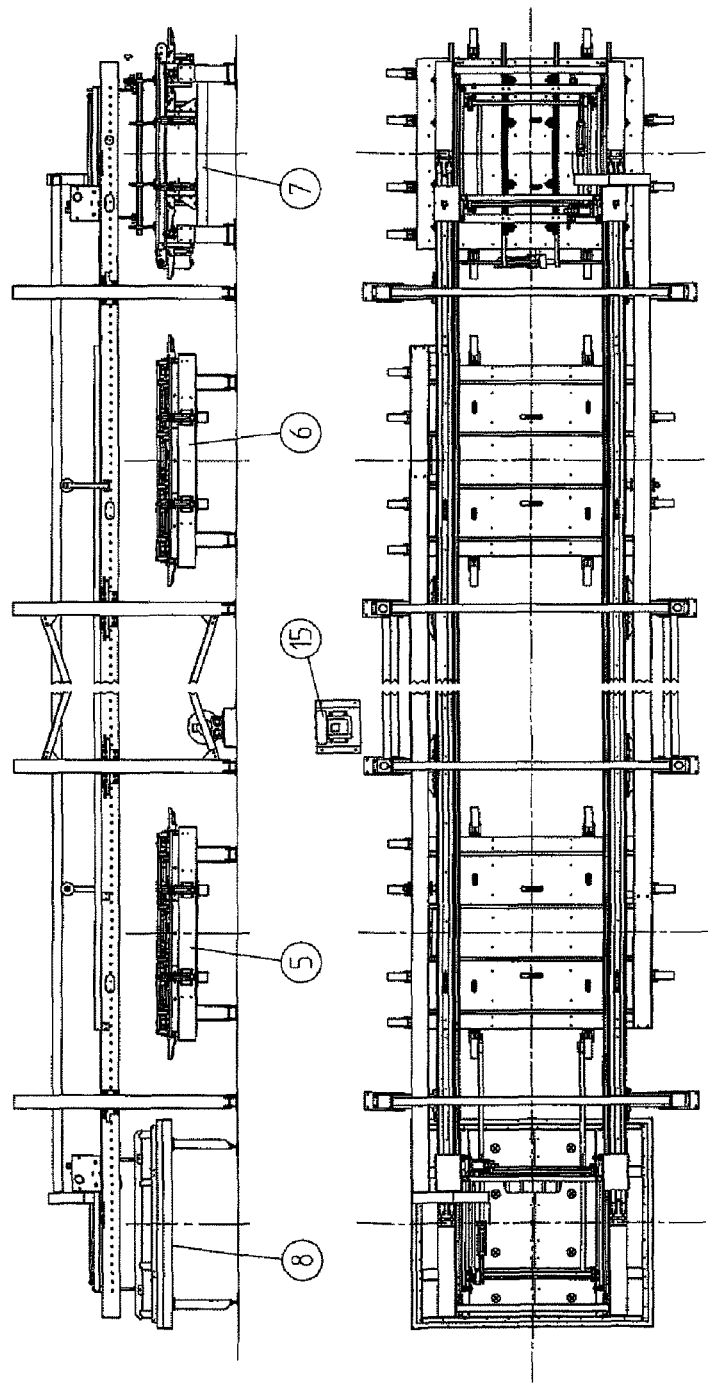
FIG. 2: shows a placement bridge with production lines.

FIG. 2 shows a placement bridge linked to a production line 1 (5) and a production line 2 (6) in the form of a cross section in the upper part, and in the form of a plan view in the lower part. The central area of the two figure elements is in this case shown interrupted in order to indicate the option of being able to insert further production lines at this point. A stacking table (8) for the film supply is shown on the left-hand side, while a conveyor belt (7) for the glass pane supply is illustrated on the right-hand side. The required substrates, the glass panes with the photovoltaically acting coating, are delivered on the respective production line (5, 6). The process of joining a photovoltaic module consists of first of all applying a film to a substrate and then a glass pane, a so-called bottom pane, such that they fit accurately.

Figure 3:
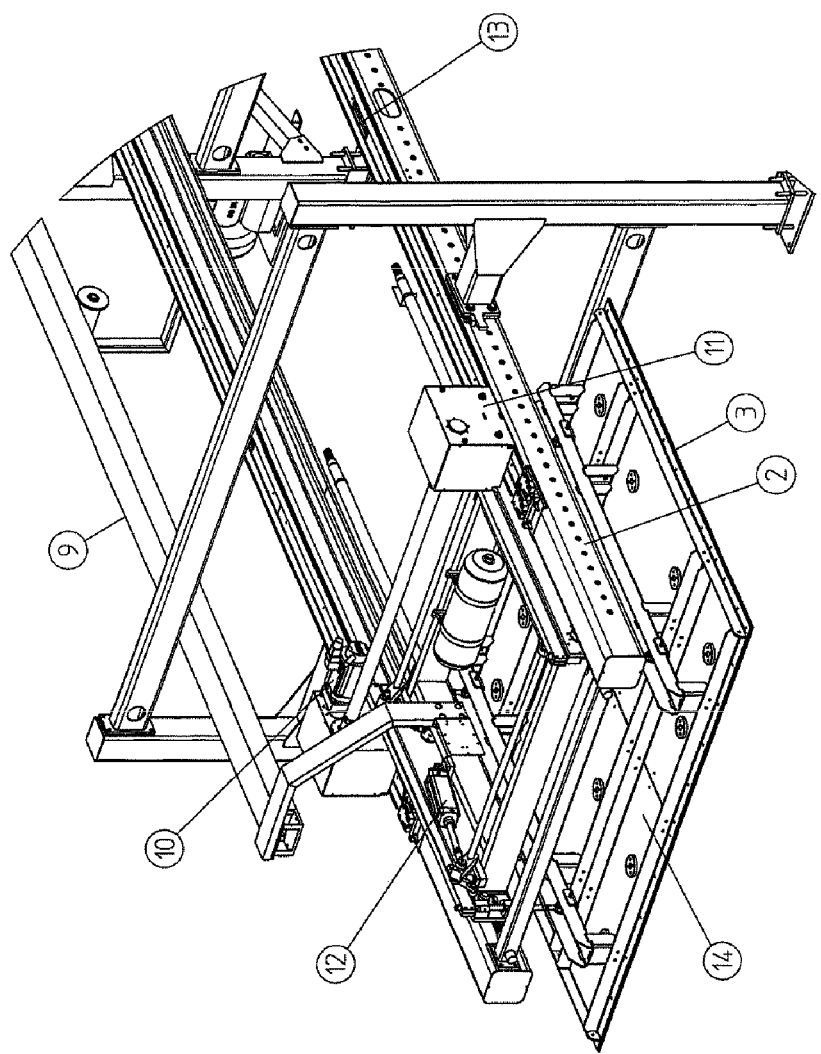
FIG. 3: shows a perspective view of the film placement.

FIG. 3 shows a perspective view of the film placement. The two gantries (cf. also FIG. 1) which are installed in this area can be seen, with two main rail supports (2), as the supporting apparatus for the entire film transport unit, one of which two main rail supports (2) is shown in more detail. The film transport frame (3) is suspended under the two main rail supports (2), and is moved closer to the two main rail supports (2) by means of the drive (12) for the vertical lifting movement, after a film has been sucked up, in order then to be moved at this height level to the area of a substrate panel which is waiting on a production line (1, 2). The drive for this movement is ensured by the servo drive (10), which acts on the two centering devices (11). The sensor (10) is used to detect a film on the stacking table (8). The vacuum-pressure pump (15) is provided for the processes of sucking up a film or a glass pane.

FIG. 3 shows one of the centering openings (13), which are arranged in pairs, for a centering pin in the main rail support (2), in this case for the production line (1). These centering openings (13) are used for precise fixing of the film transport frame (3), and ensure that a film is lowered precisely onto the substrate located underneath it when the centering pin of the film transport frame (3) is locked in this centering opening (13). The centering devices (11), which are fitted on both sides of the film transport frame (3), are used for the process of movement to the relevant point in the main rail support (2) and for lowering of the centering pin (24) (cf. also FIG. 5). The channel (9) which runs over the entire longitudinal range of a bridge, holds all the supply lines and control lines.

Figure 4:
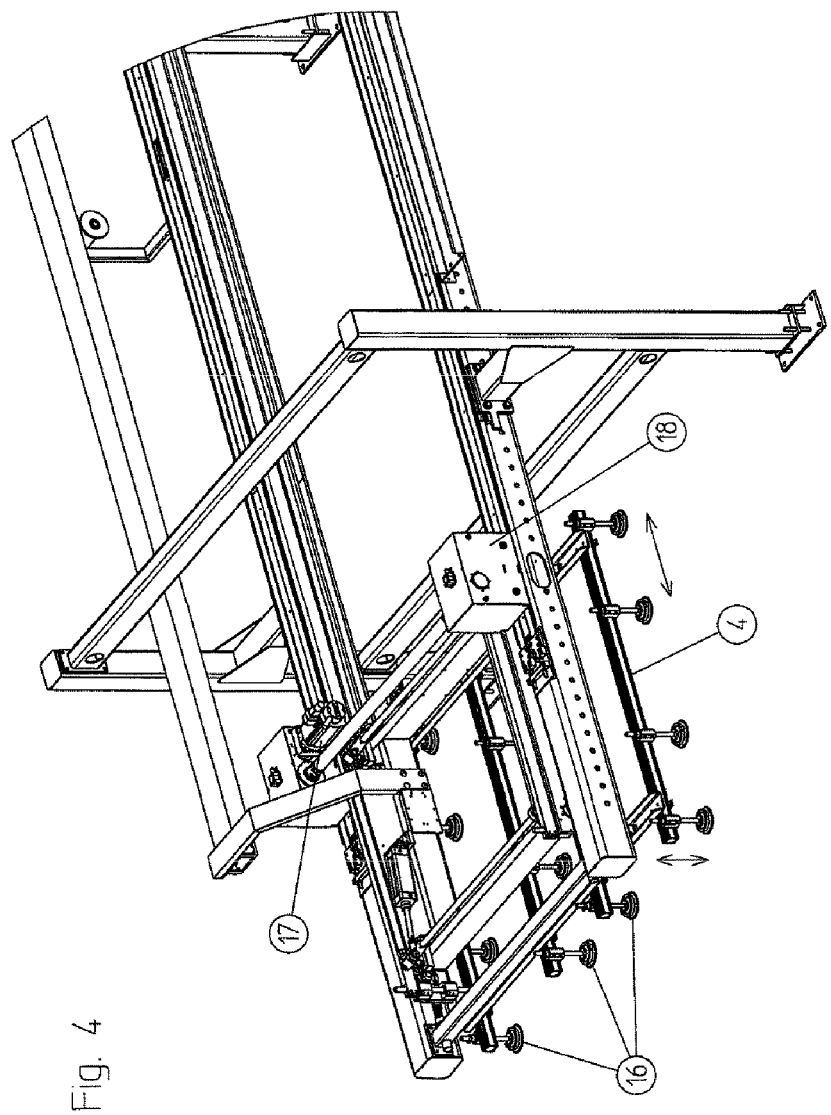
FIG. 4: shows a perspective view of the glass placement.

FIG. 4 shows the device, which corresponds to the film supply device, for supplying the glass panes by means of the glass transport frame (4). The position of the centering openings, which are annotated (19), for the glass transport frame (4) is shown only in the rear main rail support (2). The centering units for the glass transport apparatus, which correspond to the centering devices (11) for the film transport unit, are annotated (18). The servo drive (17), which drives the two centering units (18), ensures the movement of the entire glass transport device to the corresponding production line. The vacuum-pressure suckers (16) are used to raise and firmly hold the respective glass pane.

Figure 5:
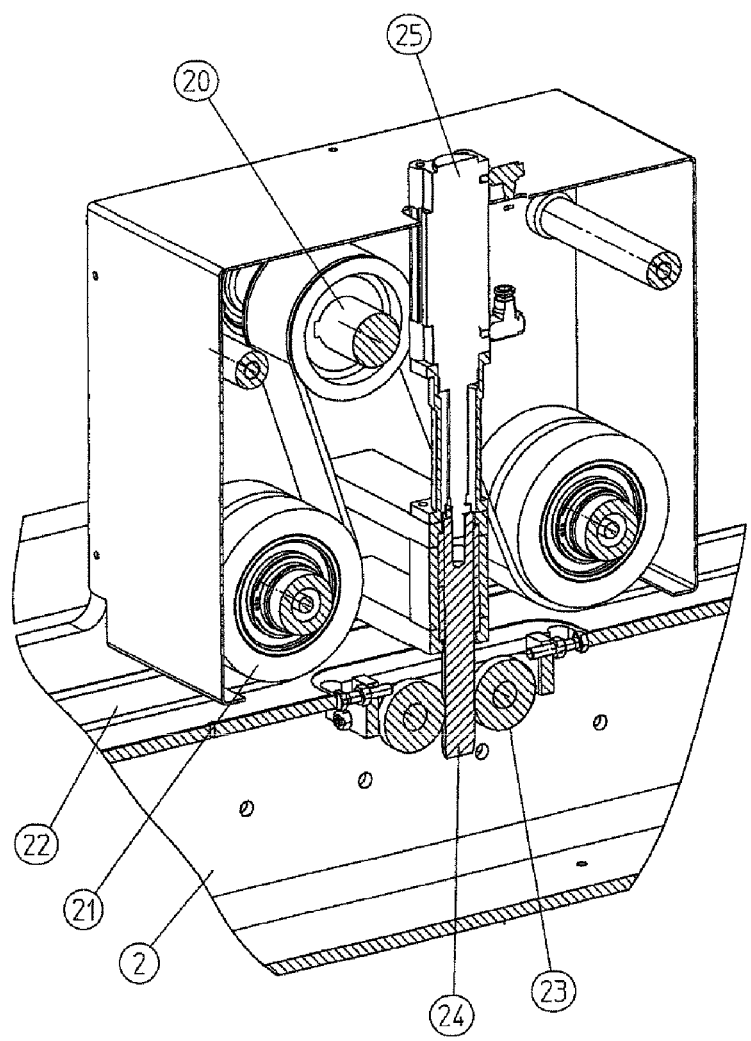
FIG. 5: shows a detailed view of a centering apparatus.

FIG. 5 shows a detailed view of a fixing apparatus.

A main rail support (2) can be seen in the lower area here, with a corresponding opening for holding a centering pin (24). Sliding rollers (23) are provided on both sides of the centering pin (24), in order to guide it. A centering pin (24) is held and lowered via a linear-movement cylinder (25). A centering unit is driven via the drive shaft (21), which moves a toothed belt (22) which is passed over the guide rollers (21).

This design measure is used in all four centering devices (11, 18) considered and is referred to as an omega drive, because of the shape in which the toothed belt is guided.

FIG. 6 shows the initial centering of the films to be applied on the stacking table (8). The principle factor in this case is the film centering means (26) that are shown. At least two film centering apparatuses (26) are in each case required in order to center a film. The number of them is in this case governed primarily by the size of the films resting thereon. The films may be placed thereon by hand or else may be taken from a magazine by an appropriately designed robot.

FIG. 7 shows the centering of a glass pane.

The glass panes are passed to this centering area via a conveyor belt (7) for glass pane supply, by means of the conveyor belts (31) which are driven by the drive (32). In this case, the glass panes are centered by means of the centering devices (29), via the drives (30). The number of centering devices (29) shown corresponds to the multiplicity of possible pane formats. An apparatus, which is not illustrated separately, for identification of defective glass panes is also located in this area. As a person skilled in the art will be aware, this works on the basis of optical detectors, and ensures that the relevant glass pane is segregated automatically in the event of a glass fault. For space reasons, this additional apparatus may be installed in the center of a placement bridge.

FIG. 8 shows the film centering on the transport frame (3).

In this case, the upper area of the figure shows the known main rail supports (2) and a centering device (11), which are attached to the gantry (1).

The two sensors (14) are used to detect the presence of a film. The film is centered on the transport frame (3) by means of the centering elements (27), with the illustrated suction openings (28) representing an entire matrix of suction openings on the film transport frame (3), which have to be activated in accordance with the format of the respective film.

The apparatus according to an embodiment of the invention not only makes it possible to produce photovoltaic elements at the same time on a plurality of production lines, but the effective control and the rapid and exact positioning of all the components of the production process furthermore ensure simultaneous operation of at least two placement bridges A and B.

Since the apparatus according to an embodiment of the invention allows the processing of photovoltaic elements of different formats, numerous sensors, which are not illustrated in detail, are required to detect these different formats and to make the appropriate adjustments to the installation parts.

A special control program is required for disturbance-free operation for the production of photovoltaic elements with a high cycle rate and a variable production program, at the same time.

A high cycle rate requires a high movement speed, for which a toothed-belt drive is once again advantageously used. However, a toothed-belt drive has a relatively high positioning tolerance, although this is reduced by means of the centering measures according to an embodiment of the invention.

Another possibility for a high movement speed is to use linear drives which, by virtue of the system, have a high positioning accuracy. However, these result in considerably greater costs.

The invention claimed is:

1. A system for automatic automatically joining substrates and glass panes, the system comprising:

production lines for delivery of the substrates;
a stacking table for films;
a glass pane supply unit;
a placement bridge for providing the films from the stacking table for films and the glass panes from the glass pane supply unit, the placement bridge comprises:
an apparatus for centering and placing the films onto a film transport frame;
an apparatus for centering and placing the glass panes onto a glass transport frame;
an apparatus for moving the film transport frame to the production lines;
an apparatus for moving the glass transport frame to the production lines;
an apparatus for lowering the films from the film transport frame onto a first substrate of the substrates; and
an apparatus for lowering the glass panes from the glass transport frame onto a second substrate of the substrates.

2. The system as claimed in claim 1, further comprising an apparatus for detecting faulty films stacked at the stacking table for films.

3. The system as claimed in claim 1, further comprising an apparatus for detecting different formats of the films stacked at the stacking table for films.

4. The system as claimed in claim 1, further comprising servo motors for driving the film transport frame and the glass transport frame.

5. The system as claimed in claim 1, further comprising an apparatus for detecting faulty glass panes placed at the glass pane supply unit.

6. The system as claimed in claim 1, further comprising an apparatus for detecting different formats of the glass panes placed at the glass pane supply unit.

7. The system as claimed in claim 1, wherein the first substrate is the same as the second substrate.

8. The system as claimed in claim 1, wherein the glass transport frame comprises vacuum pressure suckers for picking up the glass panes.

9. The system as claimed in claim 1, wherein the film transport frame comprises vacuum pressure suckers for picking up the films.

10. The system as claimed in claim 1, wherein the film transport frame comprises sensors for detecting a presence of the films.

11. The system as claimed in claim 1, wherein the placement bridge comprises centering openings in a main rail support, wherein the centering openings are configured to align the glass transport frame and the film transport frame to the production lines.

12. The system as claimed in claim 1, wherein the delivery of the substrates is clocked.

13. The system as claimed in claim 1, wherein the placement bridge comprises two placement bridges.

14. A system for automatically joining substrates and glass panes, the system comprising:
a first production line for delivery of first substrates;
a second production line for delivery of second substrates;
a stacking table for films;
a glass pane supply unit;
a placement bridge for providing the films from the stacking table for films to at least one of the first production line and the second production line and the glass panes from the glass pane supply unit to at least one of the first production line and the second production line, the placement bridge comprises:
an apparatus for centering and placing the films onto a film transport frame;
an apparatus for centering and placing the glass panes onto a glass transport frame;
an apparatus for moving the film transport frame between the stacking table for films and a relevant production line;
an apparatus for moving the glass transport frame between the glass pane supply unit and the relevant production line;
an apparatus for lowering the films from the film transport frame onto a substrate at the relevant production line; and
an apparatus for lowering the glass panes from the glass transport frame onto the substrate at the relevant production line.

15. The system as claimed in claim 14, further comprising a third production line and wherein the placement bridge is configured to provide films and glass panes to at least one of the first production line, the second production line and the third production line.

16. The system as claimed in claim 14, wherein the placement bridge comprises a plurality of placement bridges.

17. The system as claimed in claim 14, wherein the placement bridge comprises a plurality of main rail supports and at least one channel.

18. The system as claimed in claim 17, wherein the placement bridge comprises a pair of centering openings in the main rail support for each production line.

19. The system as claimed in claim 18, wherein the film transport frame comprises a first servo motor and a pair of first centering units configured to align the film transport frame with the a production line.

20. The system as claimed in claim 19, wherein the glass transport frame comprises a second servo motor and a pair of second centering units configured to align the glass transport frame with the a production line.

* * * * *

UNITED STATES PATENT AND TRADEMARK OFFICE
CERTIFICATE OF CORRECTION

PATENT NO. : 8,646,170 B2  
APPLICATION NO. : 13/001400  
DATED : February 11, 2014  
INVENTOR(S) : Helmut Weigl Page 1 of 1

It is certified that error appears in the above-identified patent and that said Letters Patent is hereby corrected as shown below:

In the Claims

In Col. 6, line 47, claim 19, after "with" delete "the".
In Col. 6, line 51, claim 20, after "with" delete "the".

Signed and Sealed this
Twenty-ninth Day of April, 2014

Michelle K. Lee
*Deputy Director of the United States Patent and Trademark Office*